United States Patent [19]

Sawada et al.

[11] Patent Number: 5,557,572
[45] Date of Patent: Sep. 17, 1996

[54] NON-VOLATILE SEMICONDUCTOR MEMORY DEVICE

[75] Inventors: Kikuzo Sawada; Hiroshi Mawatari, both of Tokyo, Japan

[73] Assignee: Nippon Steel Corporation, Tokyo, Japan

[21] Appl. No.: 307,251

[22] Filed: Sep. 16, 1994

Related U.S. Application Data

[63] Continuation-in-part of Ser. No. 231,684, Apr. 25, 1994, Pat. No. 5,491,656, which is a continuation-in-part of Ser. No. 50,660, Apr. 22, 1993, Pat. No. 5,408,429.

[30] Foreign Application Priority Data

Apr. 24, 1992 [JP] Japan .................................... 4-131491
Apr. 26, 1993 [JP] Japan .................................... 5-122013

[51] Int. Cl.$^6$ .............................. G11C 7/00; G11C 11/34
[52] U.S. Cl. ............................... 365/189.07; 365/185.22; 365/185.29
[58] Field of Search ............................. 365/189.07, 185, 365/218, 900, 185.22, 185.29

[56] References Cited

U.S. PATENT DOCUMENTS

4,698,787 10/1987 Mukherjee et al. .................... 365/185
5,077,691 12/1991 Haddad et al. ........................ 365/218
5,084,843 1/1992 Mitsuishi et al. ..................... 365/218

OTHER PUBLICATIONS

Article "Flash Memory Technology and Its Future" by Yasushi Terada, ICD91, 1991.

Primary Examiner—David C. Nelms
Assistant Examiner—Huan Hoang
Attorney, Agent, or Firm—Pollock, Vande Sande & Priddy

[57] ABSTRACT

An electrically alterable non-volatile semiconductor memory device includes a plurality of electrically alterable memory cells arranged in columns and rows, a decoder circuit which selects at least one of the plurality of memory cells and does not select others, a writing circuit for writing a selected data in the selected memory cell through the decoder circuit, a reading circuit for reading a data stored in the selected memory cell through the decoder circuit, a comparing circuit for holding the data stored in the selected memory cell and data to be written in the memory cell and comparing both the data with each other, a judging circuit for judging whether the stored data in the selected memory cell is required to be altered or not on the basis of the comparison result of the comparing circuit, and an alteration control circuit for performing altering of the data of the memory cell when stored data is required to be altered on the basis of the judgment result of the judging circuit.

4 Claims, 10 Drawing Sheets

NON-VOLATILE SEMICONDUCTOR MEMORY DEVICE

CROSS-REFERENCE TO RELATED APPLICATIONS

This application is a continuation-in-part of U.S. patent application Ser. No. 08/231,684 filed on Apr. 25, 1994, now U.S. Pat. No. 5,491,656, which is a continuation-in-part of U.S. patent application Ser. No. 08/050,660 filed on Apr. 22, 1993 now U.S. Pat. No. 5,408,429.

The contents of U.S. patent application Ser. No. 08/231,684 are incorporated herein by reference.

BACKGROUND OF THE INVENTION

1. Field of the Invention

This application relates to an electrically alterable and non-volatile semiconductor memory device or an electrically writable and erasable non-volatile semiconductor memory device.

2. Description of Related Art

Document 1: "SINGLE TRANSISTOR ELECTRICALLY PROGRAMMABLE MEMORY DEVICE AND METHOD", U.S. Pat. No. 4,698,787 (Oct. 6, 1987).

Document 2: "FLASH EEPROM ARRAY WITH NEGATIVE GATE VOLTAGE ERASE OPERATION", U.S. Pat. No. 5,077,691 (Dec. 31, 1991).

Document 3: "PRESENT STATE AND FUTURE VIEW OF FLASH MEMORY", ICD91–134, 1991.

As non-volatile semiconductor memory devices, there are an ultraviolet erasable EPROM (Erasable and Programmable Read Only Memory) and an electrically writable and erasable (hereinafter referred to as "electrically alterable") EEPROM (Electrically Erasable and Programmable Read Only Memory). Further, recently an electrically erasable flash EEPROM is developed. Data stored in memory cells of the EPROM can be erased only by ultraviolet rays and cannot be erased electrically. Accordingly, the EPROM requires a package with a transparent window. Further, it is inconvenient to alter the stored data in the EPROM after mounting the EPROM on a board of a system since the EPROM must be removed from the board once. The EEPROM can be electrically altered in a system, but the EEPROM has memory cells which require a transistor or a channel area for selective isolation and accordingly the area of each memory cell is about two times larger than that of the EPROM. In order to solve the problem, a flash type EEPROM capable of electrically erasing and having a memory cell area which is the same as that of the EPROM has been developed.

The flash type EEPROM developed in the early stage is described in Document 1, for example. According to Document 1, there is provided a method and a device structure for performing electrical writing and erasing by means of a single memory transistor having a floating gate. In the erasing operation, a high voltage of 10 to 20 volts (V) is applied to a source terminal of a memory cell and a ground potential is applied to a control gate terminal to thereby generate a high electric field in a thin insulating layer between the floating gate and the source so that electrons are ejected from the floating gate by the Fowler-Nordheim tunneling (hereinafter referred to as "FN injection") to thereby lower a threshold voltage of the memory cell as viewed from the control gate. In the writing operation, by applying a voltage of 5 to 10 V to a drain terminal of the memory cell, applying a high voltage of 10 to 15 V to the control gate and connecting a source to the ground, a strong inversion area is formed in a surface of a substrate between the drain and the source to generate hot electrons (hereinafter referred to as "HE injection"), so that electrons are injected to the floating gate to thereby raise the threshold voltage of the memory cell.

Further, in pages 4 and 5 of Documents 2 and 3, another erasing method is disclosed in which a negative voltage (for example, −7 to −15 V) is applied to the control gate of the memory cell and a power supply voltage (for example, 5 V) or a ground potential is applied to the source terminal, so that electrons are ejected from the floating gate by the FN injection. In this method, as disclosed in Document 1, since a high voltage (for example, 10 to 20 V) is not required for the source terminal, the voltage in the altering operation can be advantageously lowered. Further, in this method, since the control gate of the memory cell is generally connected to a row decoder as a word line, a voltage of, for example, 0 to 5 V can be applied to control gates of non-selected memory cells to prevent the FN injection, so that erasing in a block of the word line (or a block of sector) can be attained.

In the above erasing methods, there is the problem that data stored in those memory cells which are not required to be altered are also altered, even when data of one bit stored in one memory cell is to be altered, because the erasing operation can be performed only in a group of the memory cells or a block of sector.

SUMMARY OF THE INVENTION

It is an object of the present invention to provide a non-volatile semiconductor memory device which does not alter data in those memory cells having data which is to be unchanged, before and after, data altering operation.

In order to solve the above object, according to the present invention, an electrically alterable non-volatile semiconductor memory device comprises a plurality of electrically alterable non-volatile semiconductor memory cells arranged in columns and rows, a decoder circuit for setting at least one of the memory cells to a selected state and other memory cells to a non-selected state, writing means for performing writing of the memory cell set to the selected state through the decoder circuit, reading means for performing reading of the memory cell set to the selected state through the decoder circuit, comparing means for holding data stored in the memory cell set to the selected state and data to be newly written and comparing both the data with each other, judging means for judging whether the stored data in the memory cell set to the selected state is to be altered or not on the basis of information from the comparing means, and alteration control means for performing erasing and writing of data with one bit to alter only a memory cell whose stored data is required to be altered on the basis of information from the judging means.

According to a preferred aspect of the present invention, the alteration control means includes a control circuit for altering data in the memory cell only when the comparison of the comparing means indicates no coincidence for the bit of the memory cell.

According to a preferred aspect of the present invention, the alteration control means includes means for erasing data and writing data in the memory cell only when the comparison of the comparing means indicates no coincidence for the bit of the memory cell.

According to a preferred aspect of the present invention, the memory cell includes a floating gate.

With the above configuration, the data in the selected memory cell is compared with the data to be newly written before a writing operation, and the altering is not performed for the memory cell having data which the comparison indicates is to be unchanged, while only the memory cell having data which the comparison indicates is to be changed is selectively subjected to the erasing and writing of data with a unit of bit.

DESCRIPTION OF THE PREFERRED EMBODIMENTS

Figure 1:
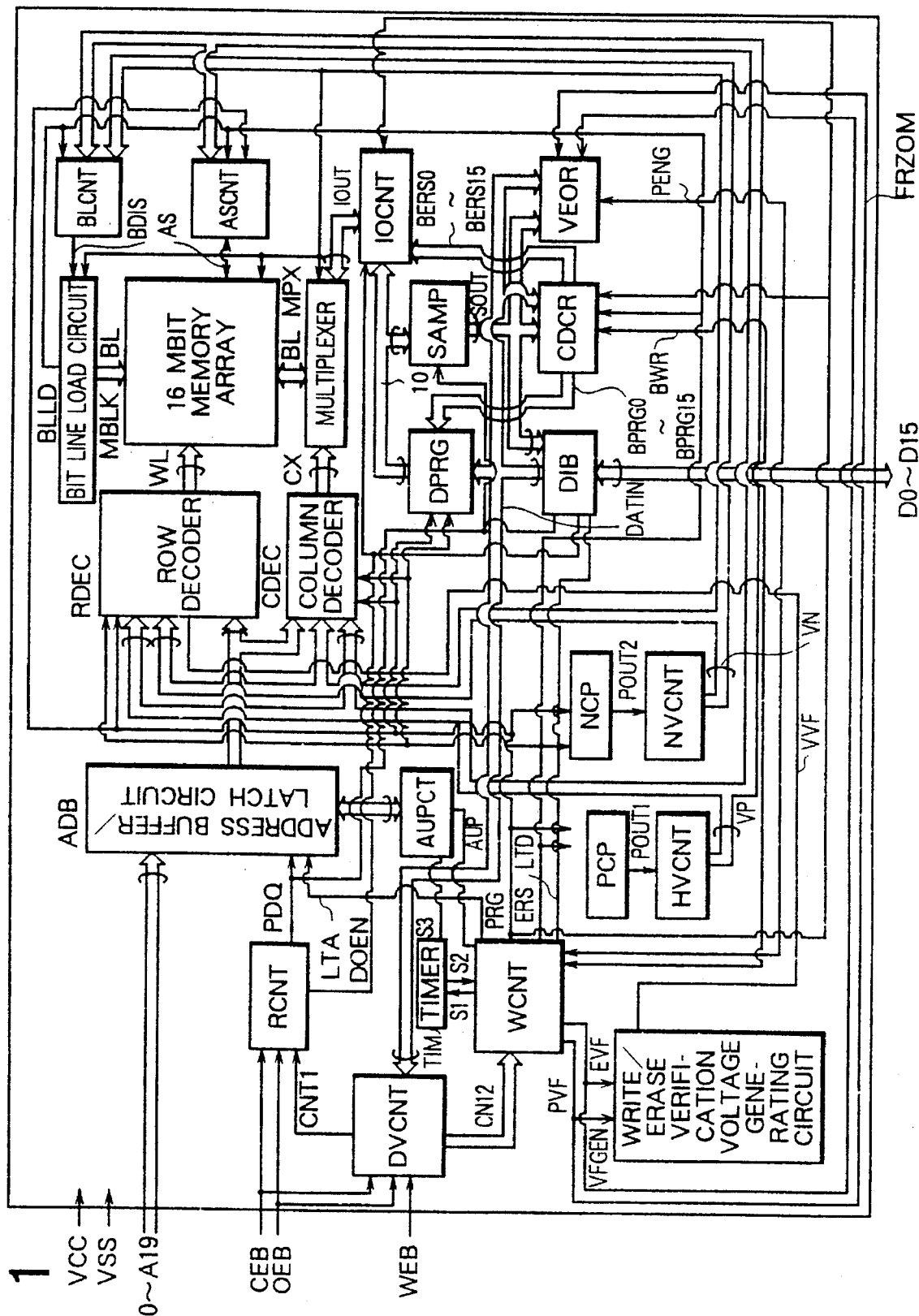
FIG. 1 is a block diagram schematically illustrating a circuit according to an embodiment of the present invention.

FIG. 1 is a circuit block diagram schematically illustrating an embodiment of the present invention. In FIG. 1, FROM represents an electrically alterable non-volatile semiconductor memory device having a memory capacity of 1048576 words×16 bits=16777216 bits, for example. Address inputs A0 to A19, a chip enable signal CEB, an output enable signal OEB, a write enable signal WEB, a power supply voltage VCC and a ground voltage VSS are input signals supplied from the outside of the FROM. Data input/outputs D0 to D15 are data inputs from the outside in the writing and erasing operation and data outputs to the outside in the reading operation. The circuit of the embodiment of FIG. 1 includes not only the circuit for writing and erasing but also a data comparison and detection circuit and a data control circuit.

In FIG. 1, DVCNT represents a device control command identification circuit, which is supplied with the write enable signal WEB, the chip enable signal CEB and the output enable signal OEB determining an operation mode of the FROM and a plurality of internal data inputs DATIN from the outside and produces a control signal CNT1 and a plurality of control signals CNT2. The control signals CNT2 include, for example, a control signal indicative of a writing mode or an erasing mode.

RCNT represents a chip/output selection state control circuit, which is supplied with the chip enable signal CEB, the output enable signal OEB and the control signal CNT1 as control input signals and produces a power down signal PDQ and an output buffer activation signal DOEN.

A write state control circuit WCNT is supplied with the control signals CNT2, a timer completion signal S2, a disturbance verification data output signal DTC and a write/erase verification data output signal PENG as control input signals and produces a write signal PRG, an erase signal ERS, a write verification signal PVF, an erase verification signal EVF, an address count up signal AUP, a timer start signal S1, an address latch signal LTA, a bit write output signal BWR and a data latch signal LTD.

A timer circuit TIM receives the timer start signal S1 from the write state control circuit WCNT and, after a lapse of a predetermined time, produces an address up clock signal S3 and the timer completion signal S2 to be supplied to an address up counter AUP and the write state control circuit WCNT, respectively.

An address buffer/latch circuit ADB is supplied with the address inputs A0 to A19 as input signals, with a power down signal PDQ as a control input signal and with an address latch signal LTA as a latch input signal and produces a plurality of internal address signals AX.

A row decoder RDEC is supplied with the internal address signals AX as decode input signals and with the write signal PRG, the erase signal ERS, a plurality of high voltage signals VP, a plurality of negative voltage signals VN and a write/erase verification voltage signal VVF as input signals and produces a plurality of (for example, 4096) word line signals WL.

A column decoder CDEC is supplied with the internal address signals AX, the write signal PRG, the erase signal ERS, the high voltage signals VP and the negative voltage signals VN and produces a plurality of (for example, 256) multiplexer selection signals CX.

A memory block MBLK includes, for example, 16777216 memory cells, each of which is connected to a word line, a bit line and a memory cell source line.

A multiplexer MPX is supplied with the multiplexer selection signals CX and includes a plurality of (for example, 4096) bit lines BL and a plurality of (for example, 16) internal data lines IOUT as input/output lines. Some of the signals of the negative voltage signals VN are supplied to substrate terminals of transistors of the MBLK and MPX.

A write/erase verification voltage generation circuit VFGEN is supplied with the write verification signal PVF and the erase verification signal EVF and produces the write/erase verification voltage signal VVF.

A comparison detection circuit CDCR is supplied with the signals on the internal data lines IO, a sense amplifier output signal SOUT and the bit write output signal BWR, the write signal PRG and the erase signal ERS produced by the write state control circuit WCNT, and produces bit erase signals BERS0 to 15 and program signals BPRG0 to 15.

A data control circuit IOCNT is supplied with the write signal PRG produced by the write state control circuit WCNT, the read signal DOEN produced by the chip/output selection state control circuit RCNT and the bit erase signals BERS0 to 15 produced by the comparison detection circuit CDCR as control input signals and with the signals on the internal data lines IO as input signals and produces IOUT.

A high positive voltage charge pump circuit PCP is supplied with the write signal PRG and the erase signal ERS and produces a positive charge pump voltage signal POUT1.

A negative voltage charge pump circuit PCP is supplied with the write signal PRG and the erase signal ERS and produces a negative charge pump voltage signal POUT2.

A high positive control circuit HVCNT is supplied with the positive charge pump voltage signal POUT1 and produces the high positive voltage signals VP.

A negative voltage control circuit NVCNT is supplied with the negative charge pump voltage signal POUT2 and produces the high negative voltage signals VN.

A memory cell array source line control circuit ASCNT is supplied with the write signal PRG, the erase signal ERS and the high positive voltage signals VP and produces a memory cell source line signal AS.

A bit line voltage control circuit BLCNT is supplied with the high positive voltage signals VP, the high negative voltage signals VN and the erase signal ERS and produces a bit line load voltage signal BDIS.

A bit line load circuit BLLD is supplied with the bit line load voltage signal BDIS and the erase signal ERS and produces a plurality of bit lines BL.

A sense amplifier circuit SAMP is supplied with the signals on the internal data lines IO as data input signals and with a power down signal PDQ as a control input signal and produces sense amplifier output signals SOUT.

A write/erase verification data coincidence detecting circuit VEOR is supplied with the sense amplifier output signals SOUT and the internal data input signals DATIN as data input signals and with the write verification signal PVF and the erase verification signal EVF as control input signals and produces a write/erase verification output signal PENG.

A data input/output buffer DIB is supplied with the output buffer activation signal DOEN and the power down signal PDQ as control input signals and with the data latch signal LTD as a latch input signal and has the sense amplifier output signals SOUT as data inputs, the internal data input signals DATIN as data outputs, and the data input/output signals D0 to D15.

A data program circuit DPRG is supplied with the internal data input signals DATIN as data input signals and with the program signals BPRG0 to 15, the write signal PRG and the erase signal ERS as control input signals and produces data output signals on the internal data lines IO.

FIGS. 2 to 5 are circuit diagrams illustrating four divisions of the circuit of FIG. 1 and represent an upper left circuit portion, a lower left circuit portion, an upper right circuit portion, and a lower right circuit portion, respectively.

In FIGS. 2 to 5, for simplification of description, the numbers of memory cells, addresses and data input/outputs are reduced as compared with FIG. 1 to an extent that the gist of the present invention is not modified. In FIGS. 2 to 5, the device control command identification circuit DVCNT, the chip/output selection state control circuit RCNT, the write state control circuit WCNT, the write/erase verification voltage generation circuit VFGEN, the write/erase disturbance detecting voltage generation circuit DSVF, the comparison detection circuit CDCR, the data control circuit IOCNT and the write/erase verification data coincidence detection circuit VEOR of FIG. 1 are omitted. Further, one kind of erase signal is shown in FIG. 1, while two kinds of erase signals and erasing methods are shown in FIGS. 2 to 5. The data input/output buffer DIB and the data program circuit of FIG. 1 correspond to a data input buffer DIB and an output buffer DBF of FIGS. 2 to 5.

In FIGS. 2 to 5, BEROM represents an electrically alterable non-volatile semiconductor memory device including address input terminals A0, A1, A2 and A3 to which an address is supplied externally, a data input terminal DIN to which an input data is supplied and an output terminal DO from which an output data is produced. The BEROM includes address buffers designated by ADB1, ADB2, ADB3 and ADB4, a row decode circuit RDEC having decoders DEC1, DEC2, DEC3 and DEC4, a column decode circuit CDEC having decoders DEC5, DEC6, DEC7 and DEC 8, a memory block MBLK having memory cells MC1 to MC16, a multiplexer MPX, a data input buffer DIB, a sense amplifier circuit SAMP, an output buffer circuit DBF, a high positive voltage charge pump circuit PCP, a negative voltage charge pump circuit NCP, a high positive voltage control circuit HVCNT, a negative voltage control circuit NVCNT, a memory cell source line voltage control circuit ASCNT, a bit line voltage control circuit BLCNT, a bit line load circuit BLLD, oscillators OSC1, OSC2 and OSC3, and other logic circuits. As a power supply for the whole circuit, a positive power supply voltage (for example, $5_wV$) is supplied from a terminal VDD and a ground voltage is supplied from a terminal VSS externally.

In electrical connection of the BEROM, the address terminals A0, A1, A2 and A3 are connected to inputs of the address buffers ADB1, ADB2, ADB3 and ADB4, respectively. Outputs AX0 and AX0B of the address buffer ADB1 and outputs AX1 and AX1B of the address buffer ADB2 are connected to inputs of NAND gates of the row decoder RDEC, and outputs AY0 and AY0B of the address buffer ADB3 and outputs AY1 and AY1B of the address buffer ADB4 are connected to inputs of NAND gates of the column decoder CDEC.

The row decoder RDEC is composed of four circuits of the DEC1, DEC2, DEC3 and DEC4 having the same circuit configuration.

The DEC1 includes a two-input NAND gate ND1 supplied with the outputs AX0B and AX1B of the address buffers ADB1 and ADB2, respectively, two two-input NOR gates NR1 and NR2, an inverter IV1, a high positive voltage switch circuit HVSW1 and a negative voltage switch circuit NVSW1. An output N1 of the ND1 is supplied to one of the inputs of each of the NR1 and NR2, and ERSB1 and CLK1 are supplied to the other inputs of the NR1 and NR2, respectively. An output N2 of the NR1 is connected to an input of the IV1, and an output N3 of the IV1 is connected to an input of the HVSW1. An output N4 of the NR2 is connected to an input of the NVSW1.

The HVSW1 is supplied with N3, a high voltage signal VPP1, WEL1 and ISO1 and includes an output connected to a row line (word line) WL0 of the memory block MBLK.

The NVSW1 is supplied with N4, WEL2 and a negative voltage signal VPN1 and includes an output connected to a same row line WL0 as the output of the HVSW1.

The DEC2, DEC3 and DEC4 have the same circuit configuration as that of the DEC1 but includes different combinations of inputs to the NAND gates from the address buffers ADB1 and ADB2 and different row lines connected to outputs thereof. The outputs of the DEC2, DEC3 and DEC4 are connected to the row lines WEL1, WEL2 and WEL3, respectively.

The column decoder CDEC is composed of four circuits of the DEC5, DEC6, DEC7 and DEC8 having the same circuit configuration.

The DEC5 includes a two-input NAND gate ND2 supplied with the output AY0B of the address buffer ADB3 and the output AY1B of the address buffer ADB4, two two-input NOR gates NR6 and NR17, an inverter IV6, a high positive voltage switch circuit HVSW2 and a negative voltage switch circuit NVSW3. An output N5 of the ND2 is supplied to one of the inputs of each of the NR6 and NR17, and an output N18 and CLK3 are supplied to the other inputs of the NR6 and NR17, respectively. Outputs N15, N16 and N17 of the NR6, IV6 and NR17, respectively, are connected to inputs of the IV6, the HVSW2 and the NVSW3, respectively.

The HVSW2 is supplied with N16, high voltage signal VPP1, WEL5 and ISO3 and includes an output connected to a column line selection signal C1 of the MPX.

The NVSW3 is supplied with N17, WEL6 and negative voltage signal VPN1 and includes an output connected to the same column line selection signal C1 as the output of the HVSW2.

The DEC6, DEC7 and DEC8 have the same circuit configuration as that of the DEC5 but includes different combinations of inputs to the NAND gates from the address buffers ADB3 and ADB4 and different column line selection signals connected to the outputs thereof. The outputs of the DEC6, DEC7 and DEC8 are connected to the column line selection signals C2, C3 and C4, respectively.

The memory block MBLK includes 16 memory cells MC1, MC2, ... MC16, each memory cell including a drain terminal, a source terminal, a control gate terminal and a floating gate, and includes a substrate terminal common to the memory cells. Each of the memory cells includes, for example, a drain region and a source region disposed on the surface of a semiconductor substrate, a thin oxide layer disposed on the surface of the semiconductor substrate between the drain region and the source region, the floating gate of, for example, polycrystalline silicon disposed on the thin oxide layer, and a control gate of, for example, polycrystalline silicon disposed on the floating gate through an inter-layer insulating layer. The drain region, the source region, the control gate and the substrate are electrically connected to the drain terminal, the source terminal, the control gate terminal and the substrate terminal, respectively. The control gate terminals of the MC1, MC2, MC3 and MC4, the control gate terminals of the MC5, MC6, MC7 and MC8, the control gate terminals of the MC9, MC10, MC11 and MC12, and the control gate terminals of the MC13, MC14, MC15 and MC16 are connected to the row lines WL0, WL1, WL2 and WL3, respectively, and the drain terminals of the MC1, MC5, MC9 and MC13, the drain terminals of the MC2, MC6, MC10 and MC14, the drain terminals of the MC3, MC7, MC11 and MC15, and the drain terminals of the MC4, MC8, MC12 and MC16 are connected to the column lines BL0, BL1, BL2 and BL3, respectively. That is, the memory cells are arranged into an array of 4 rows×4 columns. The source terminals of the memory cells MC1 to MC16 are connected to a memory source line AS in common and the substrate terminals of the memory cells MC1 to MC16 are connected to a substrate voltage signal VSUB.

The multiplexer MPX includes, for example, N channel enhancement type MOS transistors M1, M2, M3 and M4. A drain and a gate of the M1 are connected to the column line BL0 and the column selection signal C1, respectively. A drain and a gate of the M2 are connected to the column line BL1 and the column selection signal C2, respectively. A drain and a gate of the M3 are connected to the column line BL2 and the column selection signal C3, respectively. A drain and a gate of the M3 are connected to the column line BL3 and the column selection signal C4, respectively. The substrates and sources of the M1, M2, M3 and M4 are connected to the substrate voltage signal VSUB and an internal data line DIO, respectively.

The data input buffer DIB includes a two-input NOR gate NR4, inverters IV2, IV3 and IV4, N channel enhancement type MOS transistors M15, M16, M10 and M11, and P channel enhancement type MOS transistors M17, M18 and M9. One input of the NR4 is connected to the data input terminal DIN and the other input thereof is connected to WRB. An output N6 of the NR4 is connected to an input of the IV2 and an output N7 of the IV2 is connected to an input of the IV3 and a gate terminal of the M15. An output N8 of the IV3 is connected to a gate terminal of the M16 and a drain terminal of the M16 is connected to N10, which is connected to a gate terminal of the M17, a drain terminal of the M18, and gate terminals of the M9 and M10. A drain terminal of the M15 is connected to N9, which is connected to a drain terminal of M17 and a gate terminal of the M18. Source terminals and substrate terminals of the M17, M18 and M9 are connected to a high voltage signal VPP3. Source of the M15, M16 and M11 are connected to the ground terminal VSS and substrate terminals of the M15, M16, M10 and M11 are also connected to the ground terminal VSS. An input and an output WR of the IV4 are connected to WRB and a gate terminal of the M11, respectively. A drain terminal of the M11 is connected to N19, which is connected to a source terminal of the M10, and drain terminals of the M10 and M9 are connected to the internal data line DIO.

The memory source line voltage control circuit ASCNT includes inverter circuits IV5 and IV6, a two-input NOR gate NR5, a two-input NAND gate ND3, an N channel enhancement type MOS transistor M13, a P channel enhancement type MOS transistor M12 and a high positive voltage switch HVSW4. An input and an output N11 of the IV6 are connected to PRGB and one of the inputs of the NR5, respectively. The other input of the NR5 is connected to ERSB2 and one of the inputs of the ND3 is connected to PRGB. The other input of the ND3 is connected to ERSB2. An output N12 of the NR5 is connected to an input of the high positive voltage switch HVSW4 and an output N14 of the ND3 is connected to an input of the IV5, an output N15 of which is connected to a gate terminal of the M13. The HVSW4 is supplied with a high voltage signal VPP and the N12 and produces N13, which is connected to a gate terminal of the M12. A source terminal of the M12 is connected to the VPP2 and drain terminals of the M12 and the M13 are connected to the memory source line AS. A substrate terminal of the M12 is connected to the VPP2 and a source terminal and a substrate terminal of the M13 are connected to the VPN2.

The bit line load circuit BLLD includes N channel enhancement type MOS transistors M5, M6, M7 and M8. Drain terminals of the M5, M6, M7 and M8 are connected to column lines (bit lines) BL0, BL1, BL2 and BL3, respectively. Gate terminals of the M5, M6, M7 and M8 are connected to a bit erase signal ER2 and source terminals of the M5, M6, M7 and M8 are connected to the BDIS. Substrate terminals of the M5, M6, M7 and M8 are connected to the substrate voltage signal VSUB.

The bit line voltage control circuit BLCNT includes a high positive voltage switch HVSW3 and a negative voltage switch NVSW2. The HVSW3 is supplied with ER2B of an inverter IV8, WEL3, ISO2 and the high voltage signal VPP3 and produces BDIS, and the NVSW2 is supplied to an output CLK2 of the oscillator OSC2, WEL4 and the negative voltage signal VPN3 and produces BDIS.

The write signal PRG is supplied to an input of the high positive voltage charge pump circuit PCP, an input of the negative voltage charge pump circuit NCP, an input of the negative voltage control circuit NVCNT, an input of the high positive voltage control circuit HVCNT, an input of the oscillator OSC1, an input of a three-input NOR gate NR3, an input of a two-input NOR gate NR9 and an input of an inverter circuit IV7.

A block erase signal ER1 is supplied to an input of the address buffer ADB3, an input of the address buffer ADB4, an input of the high positive voltage charge pump circuit PCP, an input of high positive voltage control circuit HVCNT, and input of the negative voltage control circuit NVCNT, an input of the negative voltage charge pump circuit NCP, an input of the three-input NOR gate NR3, an input of a two-input NOR gate NR8, an input of a two-input NOR gate NR7, and inputs of the oscillators OSC2 and OSC3.

The bit erase signal ER2 is supplied to an input of the high positive voltage charge pump circuit PCP, an input of the high positive voltage control circuit HVCNT, an input of the negative voltage control circuit NVCNT, the gate terminals of the M5, M6, M7 and M8 of the bit line load circuit BLLD, an input of the three-input NOR gate NR3, an input of the two-input NOR gate NR9, an input of the two-input NOR gate NR8, an input of the two-input NOR gate NR7 and an input of the inverter IV8.

The output WRB of the NR3 is connected to an input of NR4, an input of IV4, an input of the sense amplifier circuit SAMP and an input of the output buffer DBF. The ERSB1 of the NR8 is connected to an input of NR1 and the output N18 of the NR9 is connected to an input of NR6. The ERSB2 of the NR7 is connected to inputs of NR5 and ND3 and the output CLK1 of the OSC1 is connected to an input of NR2. The output CLK2 of the OSC2 is connected to an input of NVSW2 and the output CLK3 of the OSC3 is connected to an input of NR17.

The high positive voltage charge pump circuit PCP is supplied with PRG, ER1 and ER2 and produces POUT1. The negative voltage charge pump circuit NCP is supplied with PRG and ER1 and produces POUT2. The high positive voltage control circuit HVCNT is supplied with POUT1, PRG, ER1 and ER2 and produces VPP1, VPP2, VPP3, WEL1, WEL2, WEL3, WEL4, WEL5, WEL6, ISO1, ISO2 and ISO3. The negative voltage control circuit is supplied with POUT2, PRG, ER1 and ER2 and produces VPN1, VPN2, VPN3 and VSUB.

The sense amplifier circuit SAMP is supplied with the signal on the internal data line DIO as an input signal and with the output WRB as a control input signal and produces an output SOUT. The output buffer DBF is supplied with the output SOUT as an input signal and with the output WRB as a control input signal and produces an output signal from an output terminal D0.

The writing, erasing and reading operations of the BEROM of the embodiment are now described with reference to FIGS. 2 to 5. The BEROM of the embodiment constitutes a non-volatile semiconductor memory device for performing the writing, first mode erasing and second mode erasing and reading operations by a data width of one bit with respect to the memory cells of 16 bits (4 rows×4 columns). The BEROM is supplied with A0 and A1 as the row line selection address and with A2 and A3 as the column line selection address.

Figure 4:
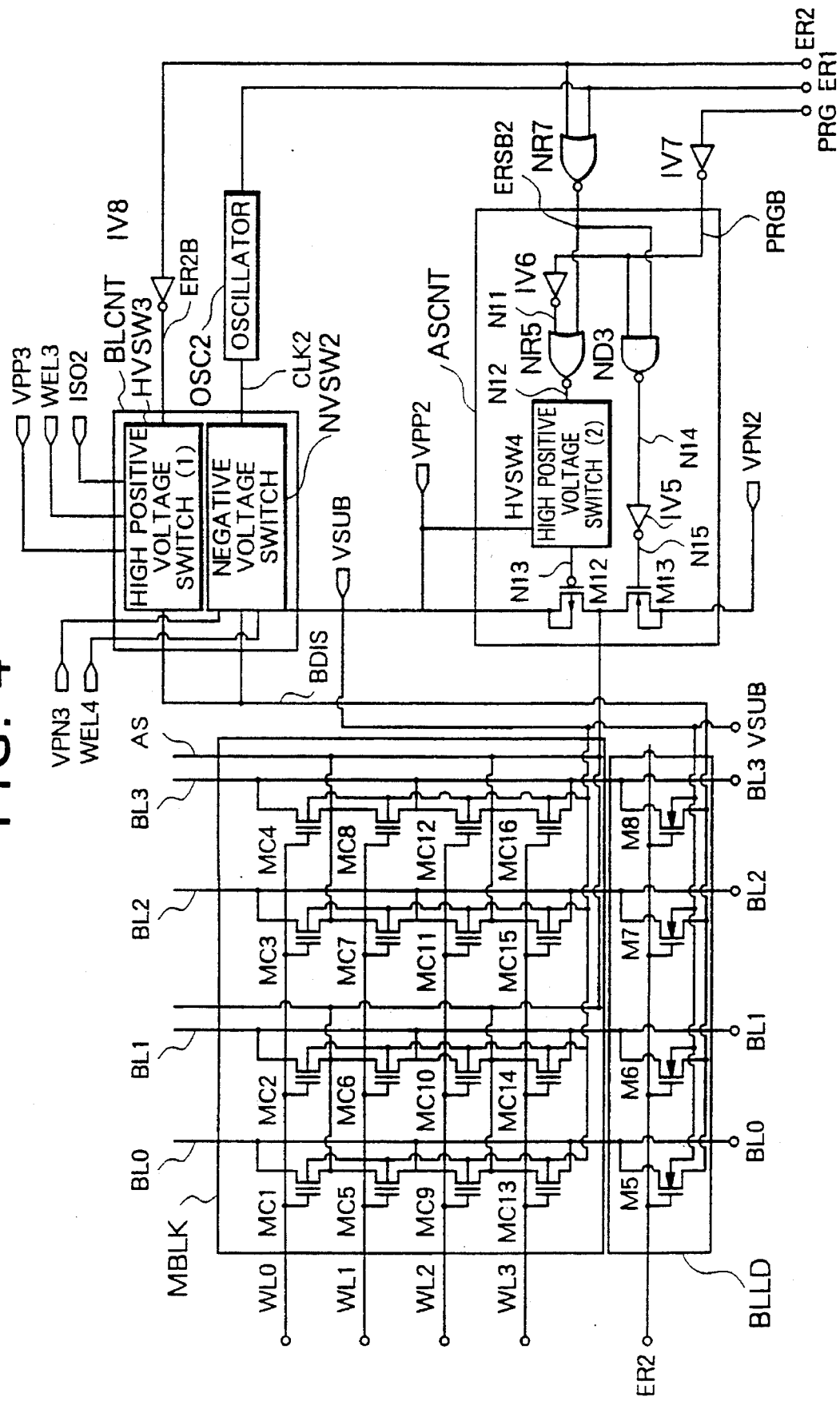

Table 1 represents an example of voltages applied to the memory cells of the system of the embodiment. Operation in each mode is now described with reference to Table 1 and FIGS. 2 to 5. The writing operation is started by switching the write signal PRG from a low ("L") level to a high ("H") level (while ER1=ER2="L" is maintained), and the negative voltage charge pump NCP starts its operation in response to a high level signal "H" of PRG. The NCP is a circuit for producing a negative voltage of, for example, −8 V from the power supply voltage (for example, 5 V) and the ground voltage (for example, 0 V), and a circuit configuration thereof is illustrated in FIG. 4 of Document 2, for example.

TABLE 1

| Mode | Selected Word Line | NonSelected Word Line | Selected Bit Line | NonSelected Bit Line | Memory Source Line | Memory Cell Subst. Volt. |
|---|---|---|---|---|---|---|
| Write | −8 V | 0 V | 5 V | 0 V | Open | 0 V |
| Erase (Block) | 10 V | 0 V | −8 V | −8 V | −8 V | −8 V |
| Erase (Bit) | 12 V | 0 V | 0 V | 5 V | 5 V | 0 V |
| Read | 5 V | 0 V | 1 V | 0 V | 0 V | 0 V |

The negative voltage control circuit NVCNT is a circuit for controlling the negative voltage and an output thereof is 0 V or a negative voltage (for example, −8 V). When PRG="H" and ER1=ER2="L", the output of the NVCNT is VPN1=−8 V and VPN2=VPN3=VSUB=0 V, for example.

Figure 5:
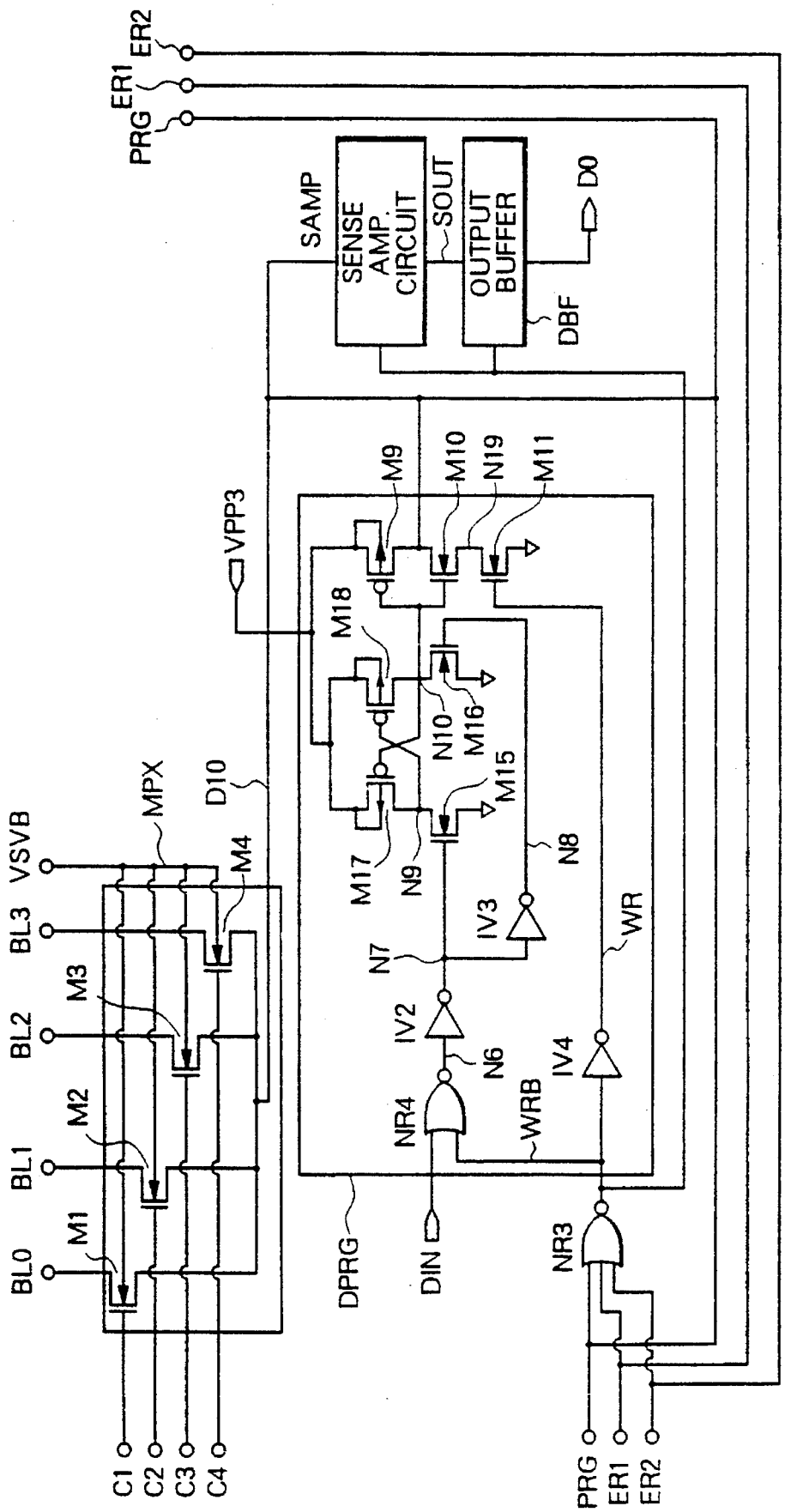

The PCP is a circuit for generating a high positive voltage of, for example, 12 V from the power supply voltage VDD and the ground voltage and a circuit configuration is illustrated in FIG. 5 of Document 2, for example. When PRG="H" and ER1=ER2="L", the high positive voltage charge pump circuit PCP operates to produce the voltage of, for example, 12 V from an output POUT thereof.

The high positive voltage control circuit HVCNT is a circuit for controlling a high positive voltage to produce output voltages between 0 V and the high positive voltage (for example, 12 V). When PRG="H" and ER1=ER2="L", the high positive voltage control circuit HVCNT produces the outputs of, for example, VPP1=WEL5=WEL6=12 V, VPP2=VPP3=WEL3=WEL4=ISO1=5 V and ISO2=ISO3= WEL1=WEL2=0V.

When the memory cell MC1, for example, is selected, the address of A0=A1=A2=A3="L" is supplied and the output of the two-input NAND gate ND1 of the row decoder DEC1 becomes "L". The oscillator OSC1 starts its oscillation in response to "H" level of the PRG and produces the output on the CLK1 (for example, amplitude of 5 V at a period of 30 MHz). The output of the two-input NOR gate NR8 becomes "H" and the output N3 of the inverter IV1 becomes "H", so that the high positive voltage switch HVSW1 is turned off. The output N4 of the two-input NOR gate NR2 produces an oscillation output in accordance with the output N1 of the ND1 and the output CLK1 of the OSC1. Thus, the negative voltage switch NVSW1 is turned on to thereby apply a voltage on the VPN1, that is, −8 V to the row line (word line) WL0. Since both of the positive voltage switch and the negative voltage switch of the row decoders DEC2, DEC3 and DEC4 are off, voltages on the row lines WL1, WL2 and WL3 are WL1=WL2=WL3=0 V, for example. With the similar operation, in the column decoder DEC5, since the high positive voltage switch HVSW2 is on and the negative voltage switch NVSW3 is off, a voltage on the column line selection signal line C1 is a voltage on the VPP1, that is, 12 V, and voltages on the other column line selection signal lines are C2=C3=C4=0 V.

When the write data of "L", for example, is applied to the data input terminal DIN, the writing operation is performed, while when the write data of "H" is applied, the writing operation is not performed. When the erasing operation is to be performed in the erasing mode, the output WRB of the NOR gate NR3 becomes "L" in the case of PRG="H" and ER1=ER2="L". In the data input buffer DIB, since DIN="L", N7="H" and N8="L", so that the same voltage as that on VPP3, that is, 5 V is produced on the internal data line DIO. When DIN="H", a voltage on the internal data line DIO is, for example, 0 V. In the multiplexer MPX, since only the transistor M1 is on, a voltage of 5 V, for example, is applied to the column line BL0 when DIN="L" and a voltage of, for example, 0 V is applied to the column line BL0 when DIN="H". Voltages on the other column lines BL1, BL2 and BL3 are 0 V, for example.

In the writing operation, in the memory cell source line voltage control circuit ASCNT, the high positive voltage switch HVSW4 becomes on and the output N13 thereof becomes the same voltage as that of VPP2, that is, 5 V since the output PRGB of the inverter IV7 is "L" and the ERSB2 is "H". Further, since the output N15 of the inverter IV5 is "L" and both of transistors M12 and M13 are off, the memory source line AS becomes an electrically open state. Since the gate voltages of the transistors M5, M6, M7 and M8 are "L", the transistors M5, M6, M7 and M8 are off.

Accordingly, in the writing operation, the control gate terminal, the drain terminal, the source terminal, and the substrate terminal of the selected memory cell MC1 are, for example, −8 V, 5 V or 0 V, the open state, and 0 V, respectively. When a voltage of 5 V is applied to the drain terminal, a high electric field is induced in the thin oxide layer between the floating gate of the drain region of the memory cell because of a voltage difference between the drain terminal and the control gate terminal and electrons are discharged from the floating gate to the drain region by the FN injection. Consequently, the threshold value of the memory cell is reduced (for example, from 7 V to 2 V), so that the memory cell becomes the written state. Since a potential difference sufficient to start the FN injection is not applied to the non-selected memory cells MC2 to MC16, the writing operation is not performed (the potential difference between the drain and the control gate exceeding 11 V, for example, is required in order to start the FN injection).

In the first mode erasing operation, the block erasing signal ER1 is "H" and PRG=ER2="L", so that the high positive charge pump circuit PCP and the negative voltage charge pump circuit NCP start operation to produce the output voltages of 12 V and −8 V, for example, on the output lines POUT1 and POUT2, respectively. The high positive voltage control circuit produces the output voltages of, for example, VPP1=WEL1=WEL2=10 V, VPP2=VPP3=ISO2=ISO3=5 V, and ISO1=WEL3=WEL4=WEL5=WEL6=0 V, and the negative voltage control circuit NVCNT produces the output voltages of, for example, VPN1=VPN2=VPN3=VSUB=−8 V.

When the address of A0=A1=A2=A3="L" is applied in the same manner as in the writing operation, the high positive voltage switch HVSW1 of the row decoder DEC1 is turned on and the negative voltage switch NVSW1 is turned off, so that the same voltage as that of the VPP1, that is, 10 V is applied to the row line (word line) WL0. Voltages on the non-selected row lines WL1, WL2 and WL3 are 0 V, for example. When the block erasing signal ER1 is changed to "H", the address buffers ADB3 and ADB4 produce the outputs of AY0=AY0B=AY1B="H" irrespective of the address value of A2 and A3 to thereby turn off the high positive voltage switch HVSW2 of the column decoders DEC5, DEC6, DEC7 and DEC8 and turn on the negative voltage switch NVSW3, so that voltages on the column line selection signals C1, C2, C3 and C4 become the same voltage as that of VPN1, that is, −8 V.

In the first mode erasing operation, in the bit line voltage control circuit BLCNT, the high positive voltage switch HVSW3 is off and the negative voltage switch NVSW2 is on, so that the same voltage as that of VPN3, that is, −8 V is applied to the output line BDIS. Since the signal levels of the gates of the transistors M5, M6, M7 and M8 of the bit line load circuit BLLD are "L" and the voltage on the substrate thereof is −8 V (VSUB=−8 V), the transistors M5, M6, M7 and M8 are turned on so that the same voltage of −8 V as the substrate voltage is applied to the column lines (bit lines) BL0, BL1, BL2 and BL3. Further, since a negative voltage is applied to the drains of the transistors M1, M2, M3 and M4 of the multiplexer MPX and a negative voltage is also applied to the gates thereof, the transistors M1, M2, M3 and M4 are turned off. Further, the voltage on the internal data line DIO is, for example, 0 V or 5 V in accordance with the input data.

In the first mode erasing operation, the erasing can not be performed with a unit of one memory cell, but the memory cells MC1, MC2, MC3 and MC4 connected to the selected row line WL0 are erased. Since a voltage of, for example, of 10 V is applied to the control gate terminals of the memory cells MC1 to MC4 and a voltage of, for example, −8 V is applied to the drain terminals, the source terminals and the substrate terminals thereof, the FN injection occurs due to the potential difference between the substrate and the control gate, so that electrons are injected to the floating gate from the substrate in each memory cell. Consequently, the thresholds of the memory cells MC1, MC2, MC3 and MC4 are increased (for example, from 2 V to 7 V) so that the memory cells MC1, MC2, MC3 and MC4 become the erased state. The first mode erasing method is also called the word line erasing, the block erasing or the sector erasing.

In the second mode erasing operation, the voltage on the bit erasing signal line ER2 becomes "H" and the voltages on the PRG and ER1 become "L" (PRG=ER1="L"), so that the high positive voltage charge pump circuit PCP starts its operation and the voltage on the output line POUT1 thereof becomes 12 V, for example. The negative voltage charge pump circuit NCP is not operated and the voltage on the output line POUT2 thereof is 0 V, for example. The high positive voltage control circuit HVCNT produces the output signals of, for example, VPP1=WEL1=WEL2=12 V, VPP2=VPP3=WEL3=WEL4=WEL5=WEL6=5 V and ISO1=ISO2=ISO3=0 V and the negative voltage control circuit NVCNT produces the output signal of, for example, VPN1=VPN2=VPN3=VSUB=0 V. When the address of A0=A1=A2=A3="L" is supplied, the high positive voltage switch HVSW1 of the row decoder DEC1 is turned on and the negative voltage switch NVSW1 thereof is turned off, so that the same voltage as that of VPP1, that is, 12 V is applied to the row line WL0. The other row lines WL1, WL2 and WL3 are not selected and the voltages on the other row lines are 0 V, for example. Further, the high positive voltage switch HVSW2 of the column decoder DEC5 is turned on and the negative voltage switch NVSW3 is turned off, so that the same voltage of 12 V as that of VPP1 is applied to the column line selection signal line C1. The voltages on the non-selected column line selection signal lines C2, C3 and C4 are 0 V, for example.

In the second erasing operation, since the input signals PRGB and ERSB2 of the memory source line voltage control circuit ASCNT are "H" and "L", respectively, that is, PRGB="H" and ERSB2="L", the high positive voltage switch HVSW4 is turned off and the node N13 becomes "L", so that the output N15 of the inverter IV5 also becomes "L". Accordingly, the transistor M13 is turned off and the transistor M12 is turned on, so that the voltage on the memory source line AS becomes the same voltage as that of VPP2, for example 5 V. When the signal of the "H" level is applied to the data input terminal DIN, the voltage on the internal data line DIO becomes 0 V and when the signal of the "L" level is applied to the data input terminal DIN, the voltage of the internal data line DIO becomes the same voltage as that of VPP3, for example 5 V. AT this time, the high positive switch HVSW3 of the bit line voltage control circuit BLCNT is turned on and the negative voltage switch NVSW2 is turned off, so that the same voltage as that of VPP3, for example 5 V is applied to the output BDIS. Further, since the gate input signals of the transistors M5, M6, M7 and M8 of the bit line load circuit BLLD are "H", the transistors are turned on. Since the transistor M1 of the multiplexer MPX is on, a current flows from the VPP3 through BDIS, BL0 and DIO to the ground terminal. At this time, by setting a resistance value of the transistor M5 to be sufficiently larger than that of the transistor M1, the voltage on the column line BL0 can be set to approximately 0 V. Further, since the column lines BL1, BL2 and BL3 have no path through which any current flows, the voltages on the column lines BL1, BL2 and BL3 are set to substantially the same voltage as that of BDIS, for example 5 V.

Accordingly, the voltages of 12 V, 5 V, 0 V and 0 V are applied to the control gate terminal, the source electrode, the drain electrode and the substrate electrode of the selected memory cell MC1, respectively, so that electrons are injected from the channel to the floating gate of the memory cell by the HE injection. Consequently, the threshold of the memory cell MC1 is raised (for example, from 2 V to 7 V). The voltage of 12 V is also applied to the control gate terminals of the non-selected memory cells MC2, MC3 and MC4, while since the voltages applied to the drain electrode and the source electrodes are as high as 5 V and there is no potential difference between the drain electrode and the source electrode, neither the FN injection nor the HE injection occurs. Since the other non-selected memory cells MC5, MC9 and MC13 have the control gate voltage of 0 V, the source electrode of 5 V and the drain electrode of 0 V, the memory cells are off and the potential difference thereof is small, so that neither the FN injection nor the HE injection occurs. Accordingly, only the selected memory cell can be erased and whether the erasing operation is performed or not can be controlled in accordance with the input data.

In the reading operation, since the voltages on the lines PRG, ER1 and ER2 are "L", that is, PRG=ER1=ER2="L" and the high positive charge pump circuit PCP and the negative voltage charge pump circuit NCP are not activated, the voltages on the output lines POUT1 and POUT2 thereof are, for example, 0 V, that is, POUT1=POUT2=0 V. The high positive voltage control circuit HVCNT produces the outputs of, for example, VPP1=VPP2=VPP3=WEL1=WEL2=WEL3=WEL4=WEL5=WEL6=5 V and ISO1=ISO2=ISO3=0 V. Further, the negative voltage control circuit NVCNT produces the outputs of, for example, VPN1=VPN2=VPN3=VSUB=0 V. At this time, the output WRB of the three-input NOR gate NR3 is "H", so that the data input buffer becomes the inactive state and the sense amplifier circuit SAMP and the output buffer DBF are activated. When the address of, for example, A0=A1=A2=A3="L" is supplied, the voltage on the row line WL0 is, for example, 5 V and when the memory cell MC1 is in the written state (for example, threshold voltage is 2 V), the memory cell MC1 is in the on state and a current flows, for example, from the sense amplifier SAMP through the internal data line DIO and the bit line BL0 (at this time, the voltage on the bit line BL0 is supplied from the sense amplifier SAMP). Further, when the memory cell MC1 is in the erased state (for example, the threshold voltage is 7 V), the memory cell MC1 is in the off state and the above-mentioned current does not flow. The current is detected and amplified by the sense amplifier SAMP and the output thereof is produced through the output buffer DBF to the output terminal DO.

Figure 6:
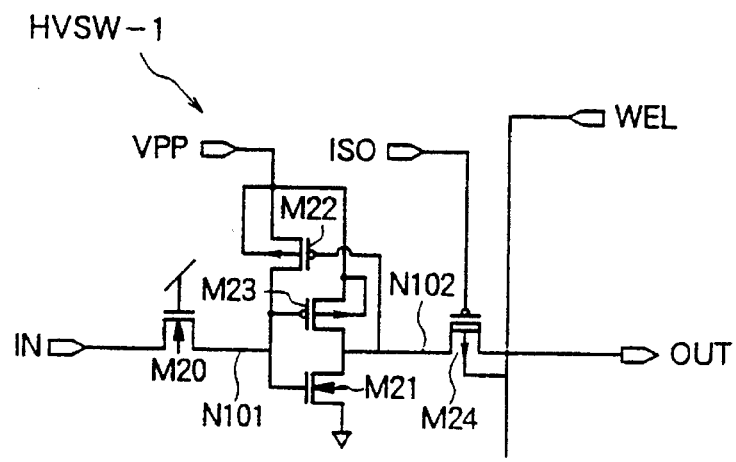
FIG. 6 is a circuit diagram of a high positive voltage switch of FIG. 2.

FIG. 6 is a schematic diagram illustrating an example of the high positive voltage switch shown in the embodiments of FIGS. 2 to 5.

The high positive voltage switch HVSW-1 of FIG. 6 includes, for example, N-channel enhancement type MOS transistors M20 and M21, P-channel enhancement type MOS transistors M22 and M23, a P-channel depletion type MOS transistor M24, a switch input terminal IN, a high positive voltage input terminal VPP, a negative voltage blocking signal input terminal ISO, a substrate input terminal WEL, an output terminal OUT, a power supply terminal, and a ground terminal. The thresholds of the N-channel enhancement type MOS transistor, the P-channel enhancement type MOS transistor, and P-channel depletion type MOS transistor are, for example, 0.8 V, −0.8 V, and 2 V, respectively.

In electrical connection of the HVSW-1, the drain terminal of the transistor M20 is connected to the switch input terminal IN and the gate terminal thereof is connected to the power supply voltage, the source terminal thereof being connected to a node N101. Further, the transistor M21 includes the gate terminal connected to the node N101, the drain terminal connected to a node N102, the source terminal connected to the ground terminal, and the transistor M22 includes the gate terminal connected to the node N102, the drain terminal connected to the node N101, and the source terminal connected to the high positive voltage input terminal VPP. The transistor M24 includes the source terminal connected to the node N102, the gate terminal connected to the negative voltage blocking signal input terminal ISO, and the drain terminal connected to the output terminal OUT. Further, the substrate terminals of the transistors M20 and M21 are connected to the ground terminal and the substrate terminals of the transistors M22 and M23 are connected to the high positive voltage input terminal VPP, the substrate terminals of the transistor M24 being connected to the substrate input terminal WEL.

The high positive voltage switch HVSW-1 is operative with any of a switch operation with the normal power supply voltage or a switch operation with the high positive voltage or a switch operation for blocking a negative voltage. In the switch operation with the normal power supply voltage, when the power supply voltage is, for example, 5 V, a voltage at the high positive voltage input terminal VPP is also 5 V, a voltage at the negative voltage blocking signal input terminal ISO is 0 V and a voltage at the substrate input terminal WEL is 5 V. At this time, when a voltage at the switch input terminal IN is 5 V, N101=5 V, N102=0 V, and the output terminal OUT=0 V. When the switch input terminal IN=0 V, the output terminal OUT=5 V. In the switch operation with the high positive voltage, when the power supply is, for example, 5 V, a voltage at the high positive voltage input terminal VPP is, for example, 12 V and voltages at ISO and WEL are 0 V and 12 V, respectively. At this time, when a voltage at the switch input terminal IN is 5 V, N1=12 V, N2=0 V and OUT=0 V. When a voltage at the switch input terminal IN is 0 V, OUT=12 V. The switch operation for blocking the negative voltage is an operation for electrically insulating the output terminal OUT from the node N102 when a negative voltage is applied to the output terminal OUT from the outside. When the power supply voltage and voltages at VPP, IN, ISO and WEL are, for example, 5 V, 5 or 12 V, 5 V, 5 V, and 0 V, respectively, voltages at the nodes N101 and N102 are 5 or 12 V and 0 V, respectively, and the transistor M24 is off even when a negative voltage is applied to the output terminal OUT.

Figure 7:
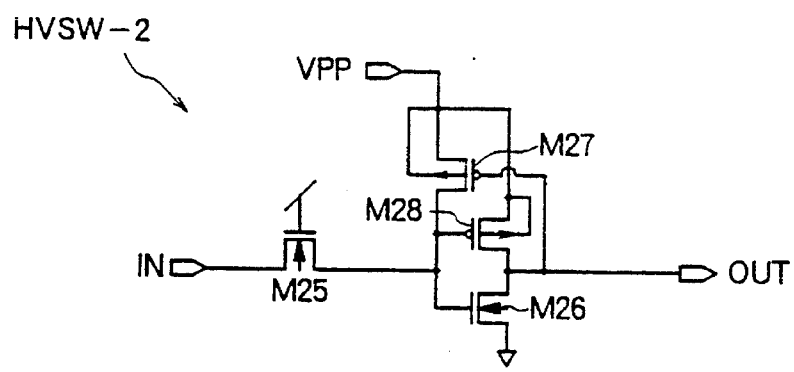
FIG. 7 is a circuit diagram of a high positive voltage switch in FIGS. 3 and 4.

The high positive voltage switch HVSW-2 of FIG. 7 has the same circuit configuration and operation as that of the high positive voltage switch HVSW-1 of FIG. 6 except that the transistor, the input terminals and the wiring required for the switch operation for blocking of the negative voltage are omitted.

Figure 8:
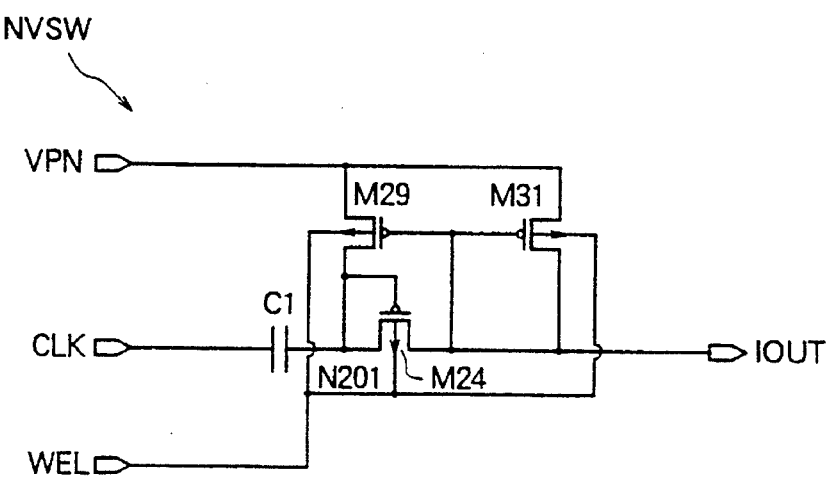
FIG. 8 is a circuit diagram of a negative voltage switch in FIGS. 2 to 4.

FIG. 8 is a schematic diagram illustrating an example of the negative voltage switch shown in the embodiment of FIGS. 2 to 5.

The negative voltage switch NVSW of FIG. 8 includes, for example, P-channel enhancement type MOS transistors M29, M30 and M31, a capacitor C1, a clock input terminal CLK, a negative voltage input terminal VPN, a substrate voltage terminal WEL, and an input/output terminal IOUT. A threshold of the P-channel enhancement type MOS transistor is, for example, −0.8 V.

In electrical connection of the negative voltage switch NVSW, the clock input terminal CLK is connected to one terminal of the capacitor C1 and a node N201 is connected to the other terminal of the capacitor C1. The gate and the drain terminals of the transistor M30 are connected to the node N201 and the source terminal thereof is connected to the input/output terminal OUT. The transistor M29 includes the source terminal connected to the negative voltage input terminal VPN, the gate terminal connected to the input/output terminal OUT, and the drain terminal connected to the node N201. The source terminal of the transistor M31 is connected to the negative voltage input node VPN and the gate and drain terminals thereof are connected to the input/output terminal IOUT. The substrate terminals of the transistors M29, M30 and M31 are connected to the substrate voltage terminal WEL.

The negative voltage switch circuit NVSW of FIG. 8 takes the switch-off state where a positive voltage is applied to the input/output terminal IOUT or the switch-on state where a negative voltage is produced to the input/output terminal IOUT. In the switch-off state, a voltage at the clock input terminal CLK is fixed to "L" or "H" level, and voltages at the negative voltage input terminal VPN and the substrate voltage terminal WEL are 0 V and 5 to 12 V, for example, respectively. At this time, even when a voltage of 5 to 12 V is applied to the input/output terminal IOUT, the transistors M29, M30 and M31 are off and the negative voltage input terminal VPN is electrically insulated from the input/output terminal IOUT. In the switch-on state, a signal on the clock input terminal CLK is oscillated (for example, with an amplitude of 5 V in a period of 30 MHz), a negative voltage, for example −8 V, is applied to the negative voltage input terminal VPN, and a voltage on the substrate voltage terminal WEL is, for example, 0 V. Since the node N201 is capacitively coupled through the clock input terminal CLK and the capacitor C1, electric charges are induced at the node N201 in accordance with a capacitance value of the capacitor C1 and an amplitude of the signal on the clock input terminal and a voltage at the node N201 changes largely in the negative direction (the voltage almost unchanges in the positive direction since a forward diode from the drains of the transistors M29 and M30 is formed because of a voltage of 0 V at the substrate voltage terminal WEL). The input/output terminal IOUT is in the open state near to 0 V upon starting of the switch operation, while the transistor M30 is turned on by changing a voltage at the node N201 to a negative voltage, and a voltage at the input/output terminal IOUT also becomes negative. Accordingly, the transistor M29 is also turned on and positive electric charges at the node N201 flow into the negative voltage input terminal VPN in accordance with the period of the signal on the clock input terminal CLK, so that the voltage at the node N201 is reduced increasingly. When the voltage at the input/output terminal IOUT is equal to the voltage at the negative voltage input terminal VPN, the transistor M29 is off and the voltage at the input/output terminal IOUT becomes, for example, −8 V.

Figure 2:
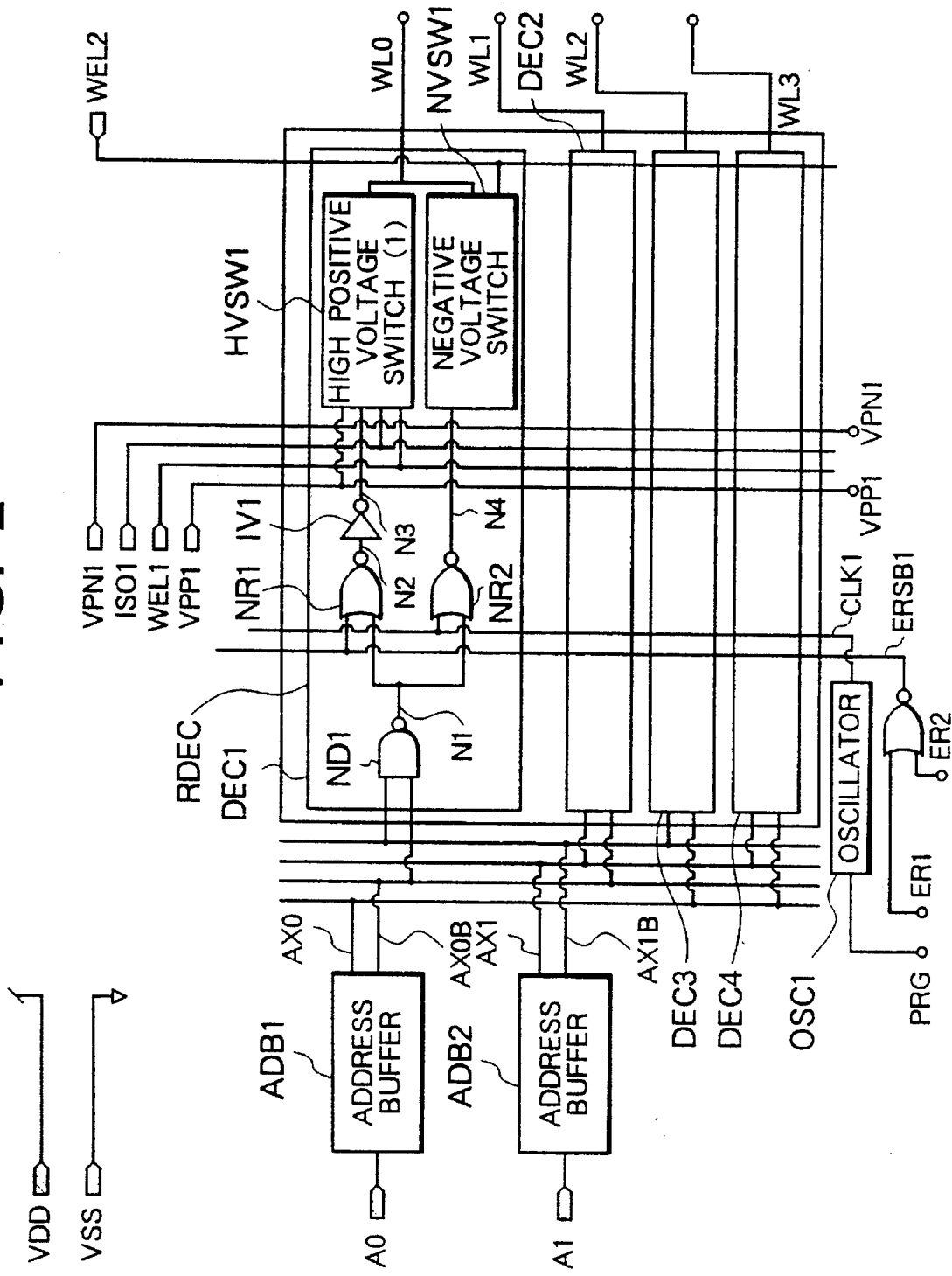
FIGS. 2 to 5 are diagrams illustrating in detail, respectively, four divisions of the circuit of FIG. 1.
Figure 3:
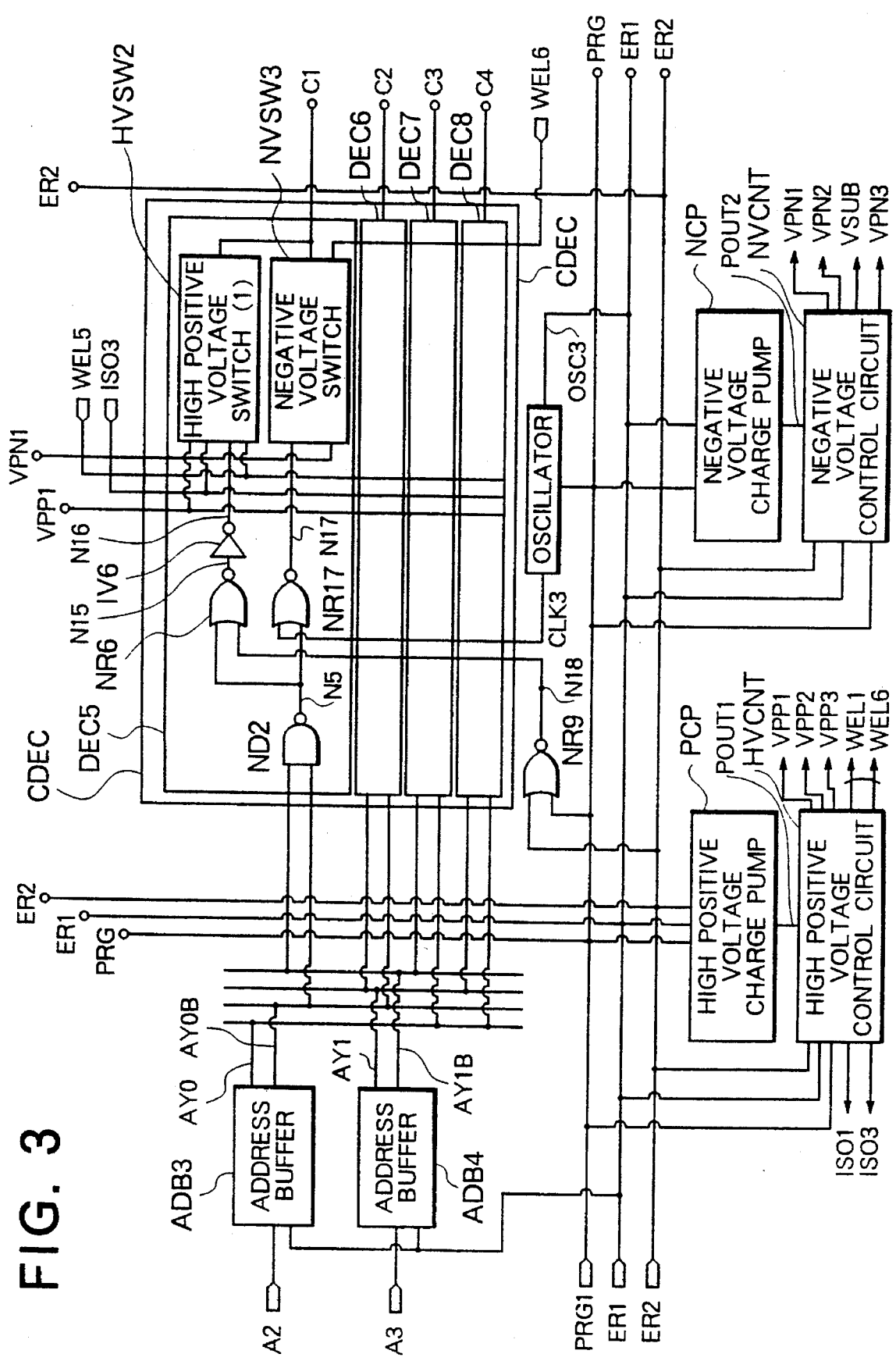

The high positive voltage switch HVSW-1 of FIG. 6 can be used in the HVSW1, HVSW2 and HVSW3 of FIGS. 2 to 5, the high positive voltage switch HVSW-2 of FIG. 7 can be used in the HVSW4 of FIGS. 2 go 5, and the negative voltage switch NVSW of FIG. 8 can be used in the NVSW1, NVSW2 and NVSW3.

The circuit and operation of the bit writing mode in the embodiment of the present invention are now described.

Figure 9:
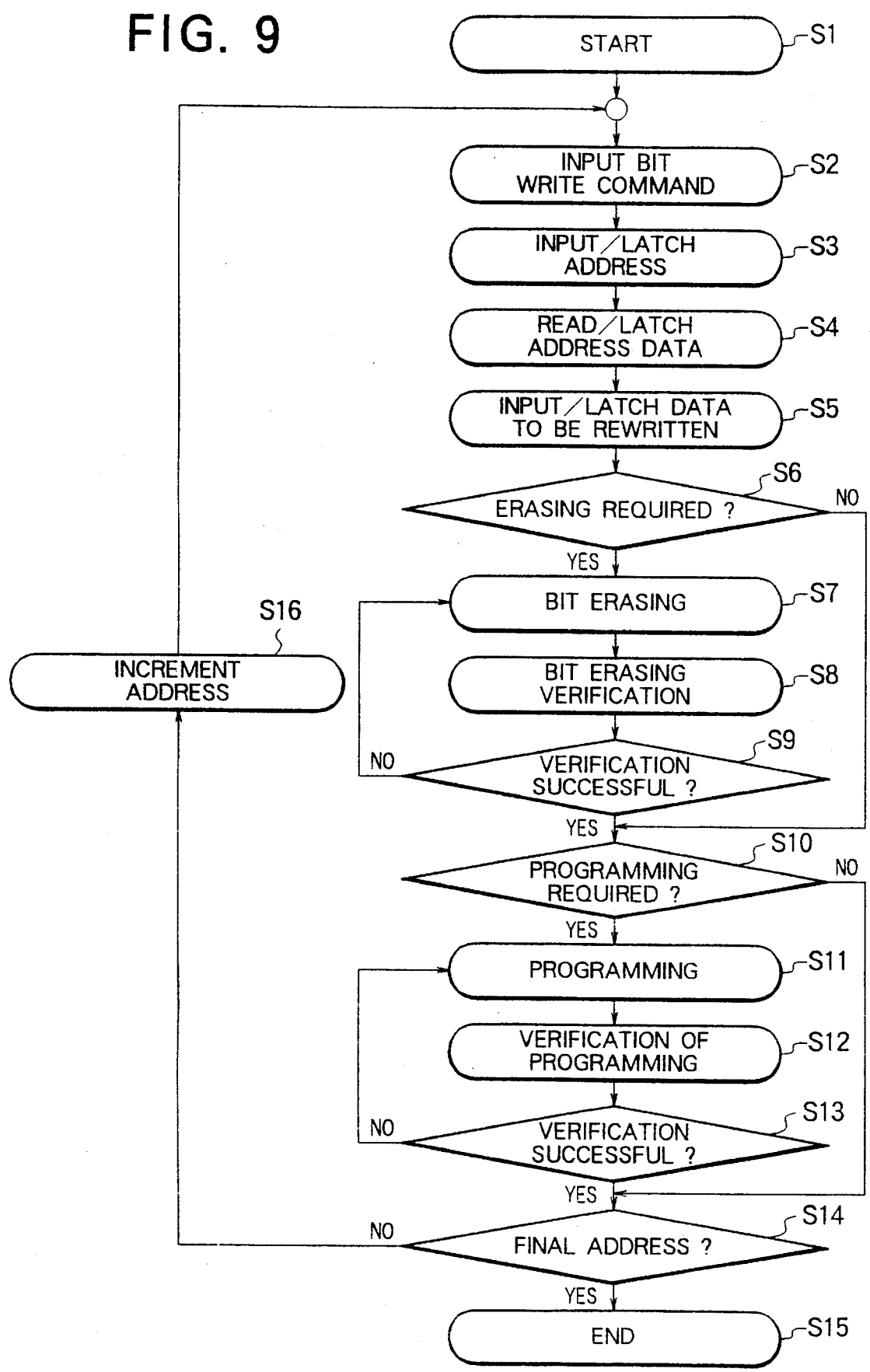
FIG. 9 is a flow chart showing a process in a bit writing mode according to an embodiment of the present invention.

FIG. 9 is a flow chart of the bit writing mode operation according to the embodiment of the present invention. In the bit writing mode of FIG. 9, signals on the control terminals CEB and WEB are set to the writing mode externally and the bit write command is inputted to the data input (S2). Then, when an address and data for the data alteration are inputted (S3), address data is read within the memory unit (S4) and is compared with data to be newly written (S5) to thereby judge whether the data is required to be erased or not (S6). The bit erasing is started for only the memory cells requiring the bit erasing (S7).

In this connection, when change of the stored data "0" of the memory cell to "1" is defined as erasing and change of the stored data "1" to "0" is defined as programming, it is judged in step S6 that the erasing is required only for the case where the data read out from the memory cell, that is, the currently stored data is "1" and the data to be newly written is "1" and it is judged that the erasing is not required for other cases.

When the erasing is judged to be unsuccessful as the verification result of the erasing, that is, when the data after the erasing is not coincident with the verification data (when change of the stored data "0" to "1" is defined as the erasing as described above, the verification data is "1"), the erasing is performed again. Further, when the verification result of the erasing is successful, that is, when the data after the erasing is coincident with the verification data, whether the programming is required or not is judged (S10). In the embodiment, only when the first read data is "1" and the data to be newly written is "0", it is judged that the programming is required and otherwise it is judged that the programming is not required. When it is judged that the programming is required, the writing is actually started (S11).

After a lapse of a predetermined time by a timer within the memory unit, the writing is completed and the verification of the writing is performed (S12). In the verification of the writing, when the actually written data is coincident with the verification data, that is, the data to be written, which is "0" in the embodiment, the writing is judged to be successful and the address for alteration is a final address or not is judged (S14). When the address for alteration is the final address, the bit writing mode is completed (S15). When the address for alteration is not the final address, the address of the memory cell to be processed is incremented by "1" and the process proceeds to step S2 so that steps S2 to S14 are repeated. Further, in step S10, when it is judged that the programming is not required, the process jumps to step S14.

Figure 10:
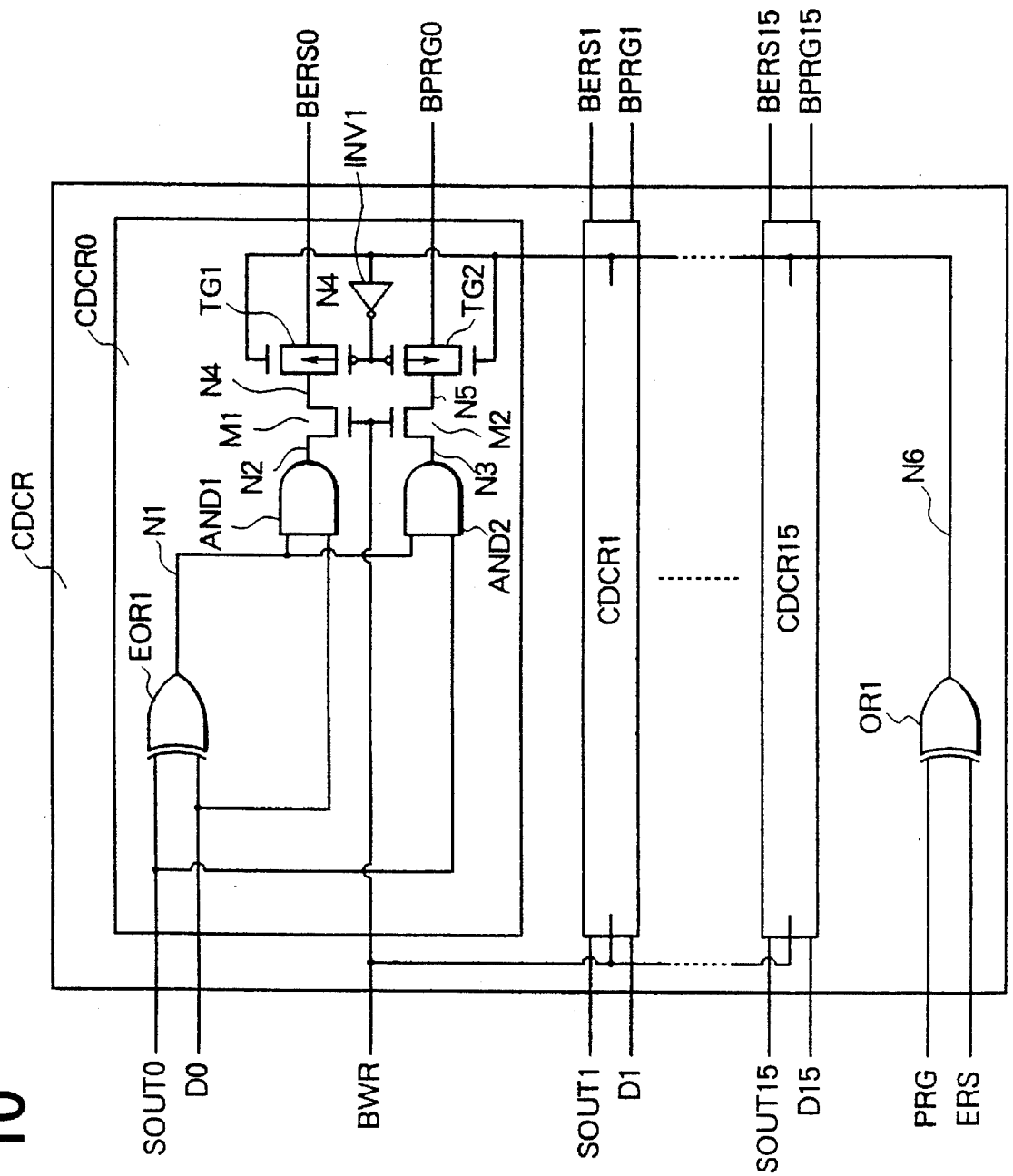
FIG. 10 is a circuit diagram of a comparison detection circuit CDCR of FIG. 1.

FIG. 10 schematically illustrates an embodiment of the comparison detection circuit CDCR shown in FIG. 1. The comparison detection circuit CDCR of FIG. 10 includes CDCR0 to CDCT15 each having a two-input exclusive OR gate EOR1, two-input AND gates AND1 and AND2, N-channel enhancement type MOS transistors M1 and M2, transfer gates TG1 and TG2 and an inverter INV1, and an OR gate OR1.

In electrical connection of the CDCR0, the two-input exclusive OR gate EOR1 is supplied with SOUT0 and D0 and produces an output N1. The output N1 of the two-input exclusive OR gate EOR1 is supplied to one inputs of the two-input AND gates AND1 and AND2. The other inputs of the two-input AND gates AND1 and AND2 are supplied with the SOUT0 and D0, respectively. The AND gates AND1 and AND2 produce outputs N2 and N3, respectively. The output N2 of the two-input AND gate AND1 is connected to a source of the N-channel enhancement type MOS transistor M1. Similarly, the output N3 of the two-input AND gate AND2 is connected to a source of the N-channel enhancement type MOS transistor M2. Gates of the N-channel enhancement type MOS transistors M1 and M2 are supplied with BWR. Outputs N4 and N5 of the N-channel enhancement type MOS transistors M1 and M2 are connected to inputs of the transfer gates TG1 and TG2, respectively. The transfer gates TG1 and TG2 produce output signals BERS0 and BPRG0, respectively.

The two-input OR gate OR1 is supplied with the signals PRG and ERS and produces an output N6. The output N6 is coupled with one of the gates of each of the transfer gates TG1 and TG2 and an input of the inverter INV1. An output of the inverter INV1 is connected to the other gates of the transfer gates TG1 and TG2. The signals BWR and N6 are supplied to the CDCR1 to CDCR15. The signals BWR, PRG and ERS are the outputs of the write state control circuit WCNT shown in FIG. 1 and are the control inputs of the comparison detection circuit CDCR.

Operation of the comparison detection circuit CDCR is now described. When the inputs SOUT0 to SOUT15 are "0000000000001010", the data D0 to D15 are "0000000000001100" and the control inputs BWR and PRG (or ERS) are, for example, "H" (5 V), the outputs BERS0 to BERS15 and the outputs BPRG0 to BPRG15 are "0000000000000100" and "0000000000000010", respectively. Similarly, when the control input BWR is, for example, "L" (0 V) or when the control inputs PRG and ERS are, for example, "L" (0 V), the outputs BERS0 to BERS15 and the outputs BPRG0 to BPRG15 become in the high impedance state (HI-Z).

Figure 11:
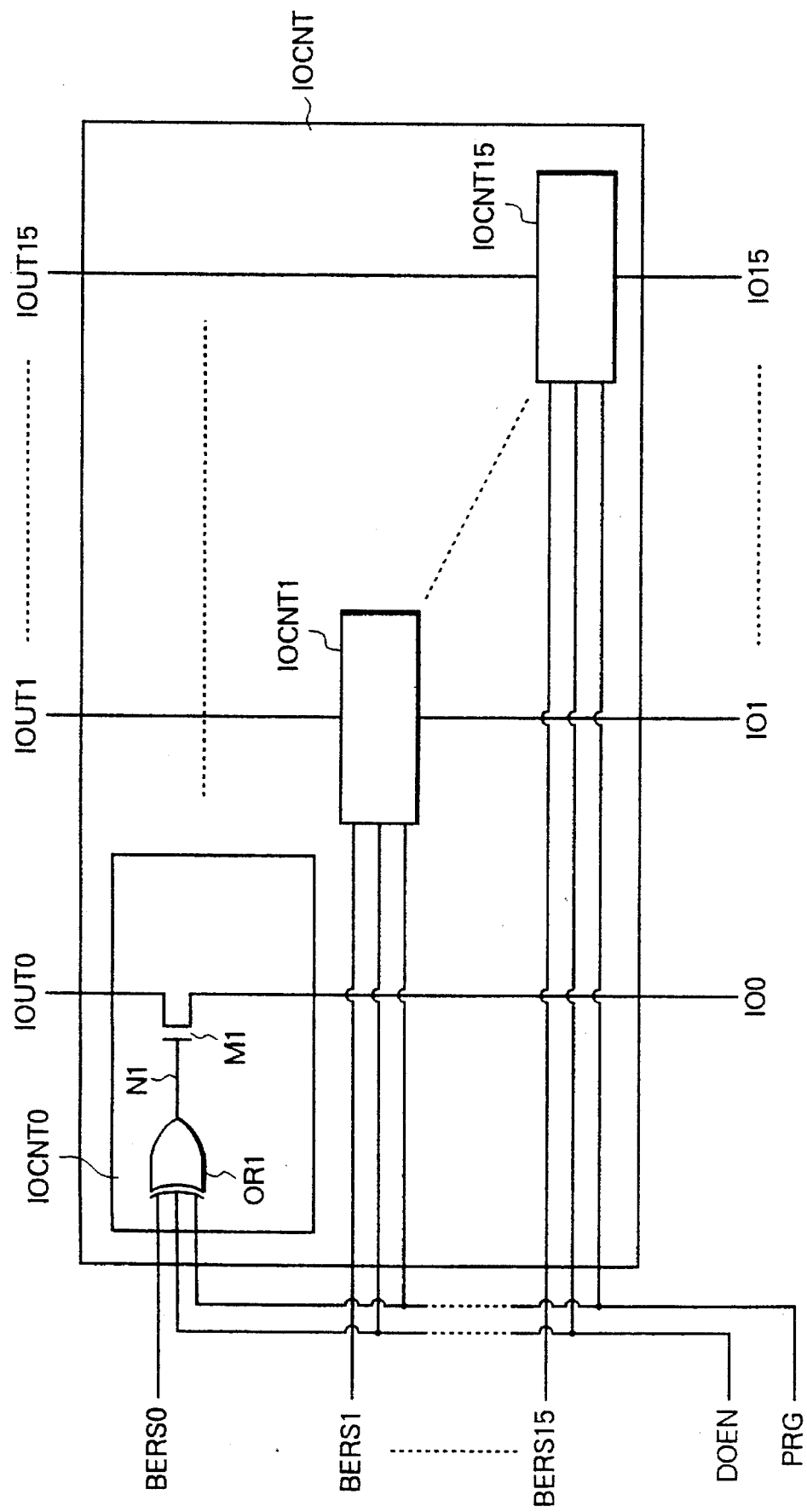
FIG. 11 is a circuit diagram of a data control circuit IOCNT of FIG. 1.

FIG. 11 schematically illustrates an embodiment of the data control circuit IOCNT shown in FIG. 1. The data control circuit IOCNT shown in FIG. 11 includes IOCNT0 to IOCNT15, each having a three-input OR gate OR1 and an N-channel enhancement type MOS transistor M1. In electrical connection of the IOCNT0, the three-input OR gate OR1 is supplied with the BERS0, DOEN and PRG and produces an output N1. The output N1 of the three-input OR gate OR1 is connected to a gate of the N-channel enhancement type MOS transistor M1. A source and a drain of the N-channel enhancement type MOS transistor M1 are connected to an IO0 of the IO and an IOUT0 of the IOUT, respectively. Further, similarly, the signal DOEN and PRG correspond to the BERS0, DOEN and PRG shown in FIG. 1. The circuit configuration of the IOCNT1 to IOCNT15 is the same as the above.

Operation of the data control circuit IOCNT is now described. When any of the input signals DOEN, PRG, BERS0 to BERS15 of the three-input OR gates included in the IOCNT0 to IOCNT15 becomes "H" (5 V), that is for example, only the input signal BERS0 becomes "H" (5 V), the N-channel enhancement type MOS transistor M1 of the IOCNT0 is turned on so that the data of IO0 is produced to the IOUT0 (however, there is no case where all of the input signals are 5 V simultaneously). Further, when all of the input signals DOEN, PRG, BERS0 to BERS15 are "L" (0 V), the N-channel enhancement type MOS transistors M1 of the IOCNT0 to IOCNT15 are off and the data of the IO0 to IO15 are not produced to the IOUT0 to IOUT15. Accordingly, the data control circuit IOCNT judges data to be altered.

Figure 12:
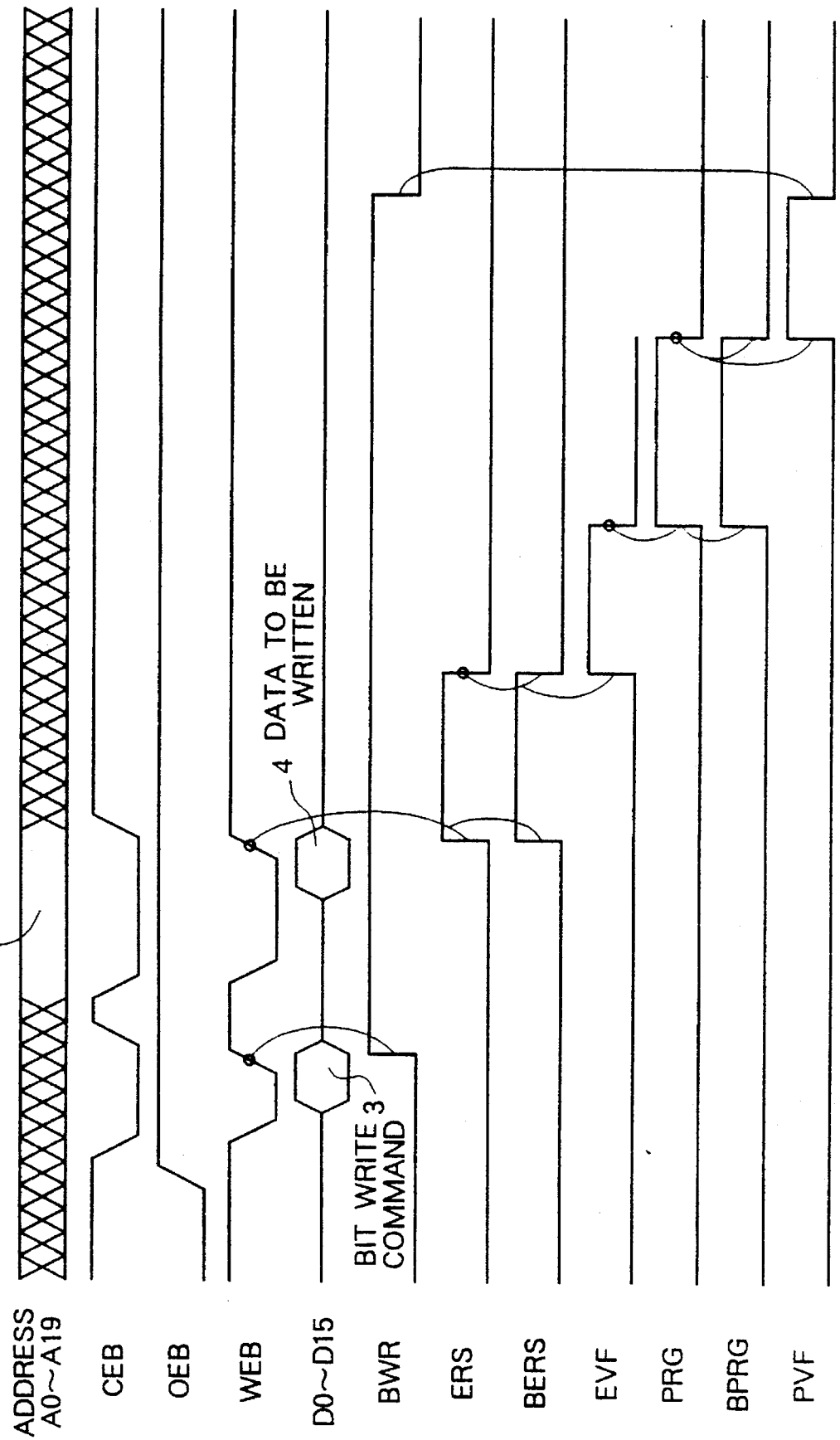
FIG. 12 is a timing diagram of signals in the process in the bit writing mode.

FIG. 12 is a timing diagram showing the bit writing operation of FIG. 9 when the operation is performed in the embodiment of FIG. 1.

When the chip enable signal CEB, the output enable signal OEB and the write enable signal WEB are "H", "L" and "H", respectively, that is, CEB="H", OEB="L" and WEB="H", the electrically alterable non-volatile semiconductor memory device FROM of FIG. 1 is in the power-down mode (or standby mode) and does not receive the address and data. Further, the data output D0 to D15 are in the high impedance state. When the signals are changed to CEB="L", OEB="H" and WEB="L", the FROM is changed to the write mode and receives the write command (that is, the write command and the erase command) from the data input/output terminals D0 to D15. When the bit write command (for example, 0000000000010000 in the binary notation) is inputted to the data input/output terminals D0 to D15, data is received upon change of the signal WEB from "L" to "H" and data (for example, 0000000000100000) is produced as the internal data signal DATIN through the data input/output buffer DIB. The data is decoded by the device control command identification circuit DVCNT when the control signals are in the above state and corresponding signals of the plurality of control signals CNT2 are changed from "L" to "H", for example. The write state control circuit WCNT prepares for latch of the write address and data in response to the signals. When the signal WEB is changed from "H" to "L" again, the address latch signal LTA is changed from "L" to "H", for example, so that the address is latched and the address data is read out. The address data is latched and is supplied to the comparison detection circuit CDCR.

Then, when the signal WEB is changed from "L" to "H", the data latch signal LTD is changed from "L" to "H", for example, so that data is latched and is supplied to the comparison detection circuit CDCR. At this time, data of the internal data signals DATIN are sent to the data program circuit DPRG and the write/erase verification data coincidence detection circuit VEOR. Further, the write state control circuit WCNT changes the erase signal (bit erase signal ERS2 of FIGS. 2 to 5), for example, from "L" to "H" in response to change of the signal WEB from "L" to "H" and starts the actual bit erasing operation. At this time, the output signal BERS of the comparison detection circuit CDCR becomes "H" and is supplied to the IO load circuit IOLD so that the bit erasing is applied only to the memory cell which requires the bit erasing. The bit erasing is described in detail in the embodiment of FIGS. 2 to 5. The write state control circuit WCNT changes the timer start signal S1 from "L" to "H", for example, at the same time as starting of the writing operation to thereby operate the timer TIM. The timer TIM changes the timer completion signal S2 from "L" to "H", for example, after the elapse of a predetermined time (for example, 10 microseconds), to thereby change the erase signal ERS (bit erase signal ERS2 of FIGS. 2 to 5) from "H" to "L", for example, so that the actual bit erasing operation is completed.

The write state control circuit WCNT changes the bit erasing verification signal EVF from "L" to "H", for example, in response to change of the erase signal ERS (bit erasing signal ERS2 of FIG. 2) from the "H" to "L", for example, to thereby start the bit erasing verification. Further, the timer start signal S1 is changed from "L" to "H", for example. When the bit erasing verification signal EVF becomes "H", the write/erase verification voltage generating circuit produces the output VVF having a voltage value of, for example, 7 V for the bit erasing verification. The voltage value is supplied through the row decoder RDEC to the control gate of the memory cell to which the writing has been performed. When the threshold voltage of the memory cell exceeds the above voltage value of 7 V due to the writing, the same data as the write data is inputted from the multiplexer MPX through the sense amplifier circuit SAMP to the write/erase verification coincidence circuit VEOR. When the threshold voltage is lower than the above voltage value of 7 V due to the writing, data different from the bit erase data is produced to the output SOUT of the sense amplifier circuit SAMP. When the data of the output SOUT is not coincident with the bit erase data, the write/erase verification coincidence detection circuit VEOR changes the write/erase verification data output signal PENG from "L" to "H", so that the write state control circuit WCNTA performs the bit erasing operation again. When the data of the output SOUT is coincident with the bit erase data, the write/erase verification output signal PENG is left to "L" and at this time the bit erase verification signal EVF is changed from "H" to "L" after a lapse of a predetermined time (for example, 1 microsecond) by the timer TIM to thereby complete the bit erase verification. Then, the write state control circuit WCNT changes the write signal PRG from "L" to "H", for example, in response to change of the bit erase verification EVF from "H" to "L" so that the actual writing operation is started. At this time, the signal BPRG produced only for the data requiring the writing and detected by the comparison detection circuit CDCR becomes "H" and is supplied to the data program circuit DPRG and the IO load circuit IOCNT. The writing operation is described in detail in the embodiment of FIG. 2. The write state control circuit WCNT changes the timer start signal S1 from "L" to "H", for example, at the same time as starting of the writing operation to thereby operate the timer TIM. The timer TIM changes the timer completion signal S2 from "L" to "H", for example, after a lapse of a predetermined time (for example, 1 millisecond) so that the writing signal PRG is changed from "H" to "L", for example, to complete the actual writing operation.

The write state control circuit WCNT changes the write verification signal PVF from "L" to "H", for example, in response to change of the write signal PRG from "H" to "L", for example, to thereby start the write verification. Further, the write state control circuit WCNT changes the timer start signal S1 from "L" to "H", for example. The write/erase verification voltage generating circuit produces the output VVF having a voltage value of, for example, 2 V for the write verification in response to change of the write verification signal PVF to "H". This voltage is applied through the row decoder RDEC to the control gate of the memory cell to which the writing has been performed. When the threshold voltage of the memory cell is lower than the above voltage value of 2 V due to the writing, the same data as the write data is inputted from the multiplexer MPX through the sense amplifier circuit SAMP to the write/erase verification coincidence detection circuit VEOR. When the threshold voltage of the memory cell is higher than the above voltage value of 2 V due to the writing, the data different from the write data is produced to the output SOUT of the sense amplifier circuit SAMP. When the data of the output SOUT is not coincident with the write data, the write/erase verification coincidence detection circuit VEOR changes the write/erase verification data output signal PENG from "L" to "H", so that the write state control circuit WCNT causes the writing operation to be performed again. When the data of the output SOUT is coincident with the write data, the write/erase verification data output signal is left to "L" and at this time the write verification signal PVF is changed from "H" to "L" after a lapse of a predetermined time (for example, 1 microsecond) so that the write verification is completed.

Just after the completion of the write verification, the altered address is confirmed finally and when the altered address is the final address, the bit write mode is completed. Further, when the altered address is not the final address, the bit write mode is repeated.

As described above, the non-volatile semiconductor memory device of the present invention operates successfully. In the circuit and operation in the bit write mode of the present invention, the programming/programming verification of data is performed after the bit erasing/bit erase verification, while the present invention is not limited thereto and the bit erasing/bit erase verification may be performed after the programming/programming verification. It will be understood easily that it can be realized by the similar circuit within the scope of the present invention. According to the gist of the present invention, the arrangement and configuration of the memory cells are not necessarily required to be made as in the embodiment and the arrangement and configuration in which a plurality of memory source lines are provided and the memory source lines are decoded by signals such as a row decode output may be made, for example.

In the embodiment, one kind of writing method and two kinds of erasing methods have been described, while the present invention does not require the writing and erasing methods to be specified. Further, the configuration of the memory cells is not specified. It is possible that another function is added to the embodiment of the present invention to add the function to the bit writing operation. In addition, the voltage values used in the embodiment are not limited thereto.

Further, in the embodiment, the binary data are written in the memory cells, while the present invention can be applied to the case where data having the ternary or more notation are written in the memory cells.

In the electrically rewrittable or alterable non-volatile semiconductor memory device, since the data alteration is not performed for the memory cell having the data which is to be unchanged before and after the data alteration, excessive control and time for the data erasing and writing as in the prior art are not required and the data alteration is performed only for the memory cell requiring the data alteration, so that the endurance characteristic of the memory cell can be improved greatly.

We claim:

1. An electrically alterable non-volatile semiconductor memory device comprising:

a plurality of electrically alterable non-volatile semiconductor memory cells arranged in columns and rows;

a decoder circuit for setting at least one of said memory cells to a selected state and other memory cells to a non-selected state;

writing means for performing writing of the memory cell set to said selected state through said decoder circuit;

reading means for performing reading of the memory cell set to said selected state through said decoder circuit;

comparing means for comparing data stored in the memory cell set to said selected state and data to be newly written therein with each other;

judging means for judging whether said data stored in the memory cell set to said selected state is required to be altered or not on the basis of the comparison result of said comparing means; and alteration control means for performing altering of the data stored in the memory cell only when said judging means judges that said stored data is required to be altered.

2. A non-volatile semiconductor memory device according to claim 1, wherein said alteration control means includes means for altering the data of the memory cell when the comparison result from said comparing means indicates no coincidence between the data stored in the memory cell and the data to be newly written.

3. A non-volatile semiconductor memory device according to claim 1, wherein said alteration control means includes means for performing erasing of data and writing of data of the memory cell when the comparison result of said comparing means indicates no coincidence between the data stored in the memory cell and the data to be newly written therein.

4. A non-volatile semiconductor memory device according to claim 1, wherein said memory cell includes a floating gate.

* * * * *